(12) United States Patent
Cornell et al.

(10) Patent No.: US 6,184,581 B1
(45) Date of Patent: *Feb. 6, 2001

(54) SOLDER BUMP INPUT/OUTPUT PAD FOR A SURFACE MOUNT CIRCUIT DEVICE

(75) Inventors: Ralph Edward Cornell, Kokomo; Aparna Vaidyanthan; Curt A Erickson, both of Carmel, all of IN (US)

(73) Assignee: Delco Electronics Corporation, Kokomo, IN (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/977,525

(22) Filed: Nov. 24, 1997

(51) Int. Cl.$^7$ .................................................. H01L 23/48
(52) U.S. Cl. .............................. 257/737; 257/8; 257/778
(58) Field of Search ............................. 257/737.8, 778, 257/737, 738

(56) References Cited

U.S. PATENT DOCUMENTS

| | | | |
|---|---|---|---|
| 4,244,002 | * 1/1981 | Sato et al. | 357/68 |
| 4,922,322 | * 5/1990 | Mathew | 257/761 |
| 5,381,307 | * 1/1995 | Hertz et al. | 361/767 |
| 5,684,677 | * 11/1997 | Uchida et al. | 361/770 |
| 5,859,474 | * 1/1999 | Dordi | 257/737 |

FOREIGN PATENT DOCUMENTS

| | | | |
|---|---|---|---|
| 57-23233 | * 2/1982 | (JP) | 257/737 |
| 59-136949 | * 8/1984 | (JP) | 257/737 |
| 2-251146 | * 10/1990 | (JP) | 257/786 |
| 4-368130 | 12/1992 | (JP) | H01L/21/321 |
| 7-273119 | 10/1995 | (JP) | H01L/21/321 |
| 10-135224 | 5/1998 | (JP) | H01L/21/321 |

OTHER PUBLICATIONS

"Unique Pad Geometry For Optimum Solder Application" pp. 465–466, IBM TDV vol. 34, No. 1, Jun. 1991.*

* cited by examiner

Primary Examiner—Roy Potter
(74) Attorney, Agent, or Firm—Jimmy L. Funke

(57) ABSTRACT

A surface mount circuit device (110), such as a flip chip, of the type which is attached to a conductor pattern (126) with solder bump connections (120). The solder bump connections (120) are formed by reflowing solder on shaped input/output pads (112) on the device (110), with the shape of the pads (112) being tailored to favorably affect optimal distribution, shape and height of the solder bump connections (120) following reflow soldering of the device (110) to the conductor pattern (126). The solder bump connections (120) are preferably characterized by a shape that increases the stand-off height of the device (110). The shaped solder bump connections (120) also promote stress relief during thermal cycling, improve mechanical bonding, allow better penetration of cleaning solutions, and improve flow of encapsulation materials between the device (110) and its substrate (122).

11 Claims, 2 Drawing Sheets

SOLDER BUMP INPUT/OUTPUT PAD FOR A SURFACE MOUNT CIRCUIT DEVICE

This invention was made with Government support under Agreement No. MDA972-95-3-0031 awarded by DARPA. The Government has certain rights in the invention.

FIELD OF THE INVENTION

The present invention generally relates to surface mount (SM) circuit devices. More particularly, this invention relates to a solder bump input/output pad for a surface mount device, wherein the pad is configured to control the shape and height of a solder bump connection between the device and a conductor following registration and reflow attachment of the device to a conductor pattern.

BACKGROUND OF THE INVENTION

A flip chip is generally a monolithic surface mount (SM) semiconductor device, such as an integrated circuit, having bead-like terminals formed on one of its surfaces. As illustrated in FIG. 1, the terminals are typically in the form of solder bumps 12 near an edge 14 of the flip chip 10. The solder bumps 12 serve to both secure the chip 10 to a circuit board (not shown) and electrically interconnect the flip chip circuitry to a conductor pattern (not shown) formed on the circuit board, which may be a ceramic substrate, printed wiring board, flexible circuit, or a silicon substrate. Due to the numerous functions typically performed by the microcircuitry of a flip chip, a relatively large number of solder bumps are required. As also shown in FIG. 1, the solder bumps 12 are formed on circular-shaped, electrically-conductive input/output pads 16 that are electrically interconnected with the circuitry on the flip chip 10 through vias 18. The size of a typical flip chip is generally on the order of a few millimeters per side, resulting in the solder bumps 12 being crowded along the edge 14 of the flip chip 10. As a result, flip chip conductor patterns are typically composed of numerous individual conductors that are typically spaced apart about 0.5 millimeter or less.

Because of the narrow spacing required for the solder bumps and conductors, soldering a flip chip to its conductor pattern requires a significant degree of precision. Reflow solder techniques are widely employed for this purpose, and entail precisely depositing a controlled quantity of solder on the circular-shaped input/output pads of the flip chip using methods such as electrodeposition. Once deposited, heating the solder above its liquidus temperature serves to form the characteristic spherically-shaped solder bumps on the pads. After cooling to solidify the solder bumps, the chip is soldered to the conductor pattern by registering the solder bumps with their respective conductors and then reheating, or reflowing, the solder so as to metallurgically adhere, and thereby electrically interconnect, each solder bump with its corresponding conductor, forming what will be referred to herein as a solder bump connection.

Placement of the chip and reflow of the solder must be precisely controlled not only to coincide with the spacing of the terminals and the size of the conductors, but also to control the height of the solder bump connections after soldering. As is well known in the art, controlling the height of solder bump connections after reflow is often necessary to prevent the surface tension of the molten solder bumps from drawing the flip chip excessively close to the substrate during the reflow operation. Sufficient spacing between the chip and its substrate, which may be termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

Solder bump position and height are generally controlled by the amount of solder deposited on the circular-shaped pads to form the solder bump and/or by limiting the surface area over which the solder bump is allowed to reflow on its conductor. Within certain limits, smaller input/output pads promote a greater height for solder bump connections after reflow for a given quantity of solder, though an excessively small pad tends to produce a solder bump characterized by a poor connection due to inadequate adhesion. On the other hand, limiting the reflow surface area of a conductor typically involves the use of solder stops formed on each conductor to which a flip chip is to be registered. Because each solder bump is registered and soldered directly to a conductor, the conductors must be formed of a solderable material, which as used herein means that a tin or lead-base solder with suitable alloying additives is able to adhere to the conductor through the formation of a metallurgical bond. In contrast, the solder stops are intentionally formed of a nonsolderable material, i.e., a tin or lead-base solder will not adhere to the material for failure to form a metallurgical bond. Consequently, the solder stops determine the surface area of a solderable conductor over which the solder bump is able to flow during reflow, which in turn assist in determining the height of the resulting solder bump connection and therefore the stand-off height of the flip chip relative to the substrate.

While flip chip conductors equipped with solder stops are widely used in the art, trends in the industry have complicated the ability for solder bumps with solder stops to yield solder connections that provide adequate stand-off heights for flip chips. Specifically, as flip chips have become more complex, the number of bumps that must be accommodated along the chip perimeter has increased. In turn, the conductors to which the bumps are registered and soldered have become more closely spaced and narrower, e.g., line widths of about 0.4 millimeter or less. Such circumstances have complicated the design and fabrication of solder stops. As a result, solder bump connections having adequate stand-off height are more difficult to consistently produce, which increases the difficulty of adequately dispersing encapsulation materials between flip chips and their substrates. Inadequate stand-off height also renders the solder connections more susceptible to fatigue fracture and increases the difficulty with which solder flux residue is removed following the solder process. Finally, if inadequate stand-off height occurs with fine pitch conductors, interaction and solder bridging between adjacent solder bump connections is also more likely to occur due to excessive lateral flow of the solder during reflow.

Accordingly, it would be desirable if an improved method were available for controlling the stand-off height of a surface mount device following reflow in which a solder bump connection is formed to electrically and mechanically attach the device to a conductor pattern. It would also be desirable if such a method was particularly applicable to surface mount devices having fine pitch terminal patterns.

SUMMARY OF THE INVENTION

It is an object of this invention to provide a surface mount circuit device, such as a flip chip, with input/output pads that are configured to promote the stand-off height of the device by favorably affecting the shape and height of solder bumps connections formed when the device is registered and reflow soldered to a conductor pattern.

It is still another object of this invention that the input/output pads enable center-to-center spacing between solder bump connections to be reduced without increasing the potential for solder bridging between solder bump connections.

It is yet another object of this invention that the input/output pads facilitate processing and promote reliability of the device.

The present invention provides a surface mount circuit device, such as a flip chip, of the type which is attached to a conductor pattern with solder bump connections. The solder bump connections are characterized as having a shape that increases the stand-off height for the device, promotes stress relief during thermal cycling, improves mechanical bonding and allows penetration of cleaning solutions and encapsulation materials between the device and its substrate.

According to this invention, the above advantages are achieved by forming shaped input/output pads on the surface mount circuit device, with the shape of each pad being selectively formed to favorably affect the distribution, shape and height of a solder bump connection formed on the pads following reflow soldering of the device to a conductor pattern on the substrate. Shapes particularly capable of achieving the benefits of this invention are those in which the input/output pad is elongate in a direction perpendicular to an edge of the circuit device. According to this invention, a molten solder alloy will coalesce on the pads, such that the shape of the pads determines the shape, height and distribution of the resulting solder bump connection following reflow. As a result, input/output pads formed according to this invention can be appropriately sized and shaped to ensure that solder bumps formed thereon and then registered with a conductor will yield solder bump connections having an adequate height and a favorable shape for allowing an encapsulation material to flow between the device and substrate. In addition, this invention unexpectedly promotes certain process and reliability-related properties, including an increase in the distance between adjacent solder bumps without a corresponding increase in center-to-center pad and conductor spacing, reduced stress at the bump-chip and bump-conductor interfaces, and improved chip alignment.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 2:
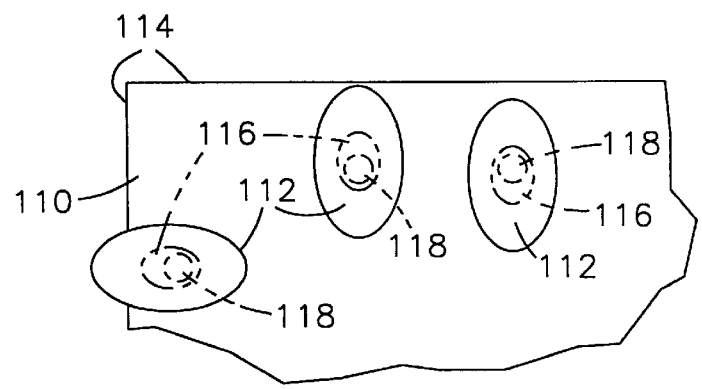
FIG. 2 is a plan view of a corner of a flip chip having oblong input/output pads configured in accordance with this invention.
Figure 3:
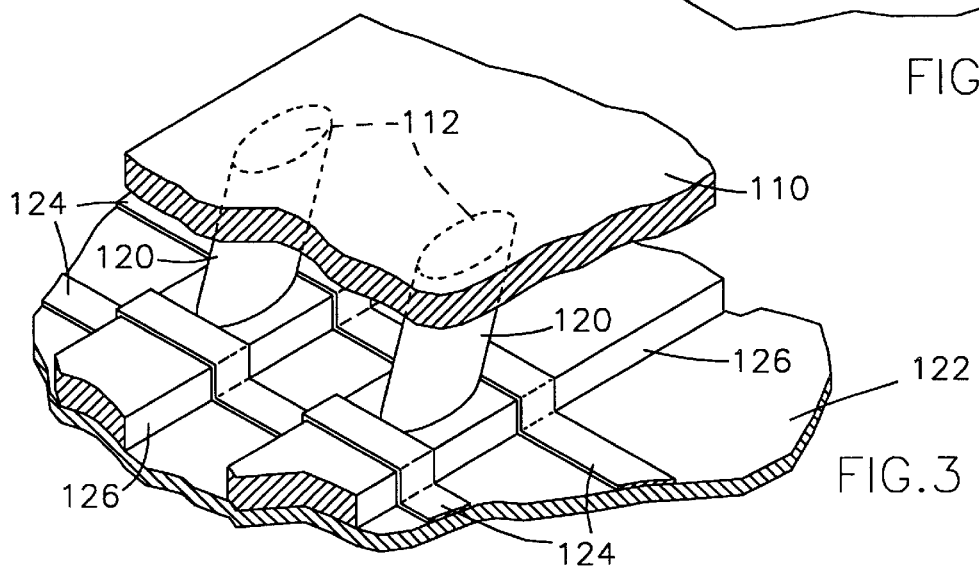
FIG. 3 is a fragmentary perspective view of the flip chip of FIG. 2 registered with a conductor pattern in accordance with this invention.

FIG. 2 represents a corner of a flip chip 110 equipped with shaped input/output pads 116 configured in accordance with this invention, as well as solder bumps 112 whose shapes have been determined by the shape of the input/output pads 116. As is conventional, the surface of the chip 110 surrounding the pads 116 is nonsolderable as a result of a thin layer of a dielectric material (not shown), such as silicon dioxide, that serves to protect the surface of the chip 110 from environmental contaminants, moisture and electrical shorts. FIG. 3 represents solder joint connections 120 formed by the solder bumps 112 following registration and reflow attachment of the chip 110 to a conductor pattern 126 on a substrate 122, which may be a ceramic substrate, printed wiring board, flexible circuit, or a silicon substrate as is known in the art.

As is evident from FIG. 2, the shape of the input/output pads 116 in combination with the nonsolderable surface of the chip 110 causes the solder bumps 112 to have a congruent shape to the pads 116 after reflow. As a result, the shapes of the pads 116 dictate the shapes of the solder bumps 112, as well as the resulting solder bump connections 120 depicted in FIG. 3. Furthermore, it has been determined that the size and shape of the pads 116 also control the height, shape and distribution of the solder bump connections 120 following reflow. As the molten solder alloy coalesces during reflow, the surface tension of the alloy constrains the final shape of the solder bump connection 120 in accordance with the size and shape of the pads 116. Based on this determination, the present invention provides for tailoring the shape of the input/output pads 116 to control the height of their resulting solder bump connections 120.

Certain shapes for the input-output pads 116 have been found to promote one or more additional processing and mechanical advantages for solder bump connections 120, such as minimizing the stress in the solder bump connection 120 by controlling the shape of the reflowed solder. According to this invention, such shapes also serve to increase the distance between adjacent solder bump connections 120 without resorting to increasing the distance between their conductors, avoid solder bridging between adjacent solder bump connections 120 by drawing the molten solder out along the lengths of their conductors during reflow, improve the alignment of the chip 110 to the conductors of its conductor pattern by optimally shaping the pads 116 at the corners of the chip 110, and enable easier epoxy underfill by shaping the pads 116 to generate solder bump connections 120 that direct epoxy under the chip 110.

Various compositions could be used for the solderable material that forms the input/output pads 116 of the present invention. A preferred metallurgy is a multilayer metal structure, with a bottom layer of aluminum deposited directly on the conductive material in the vias 118, followed by a layer of a nickel-vanadium alloy and then a copper layer. The copper layer is readily solderable, i.e., can be wetted by and will metallurgically bond with solder alloys of the type used for solder bumps. As such, the copper layer promotes the formation of the solder bump 112 with known bumping techniques. Another suitable composition for the input-output pads 116 is a known electroless nickel with a top layer of gold that readily wets and bonds with solder alloys.

Figure 1:
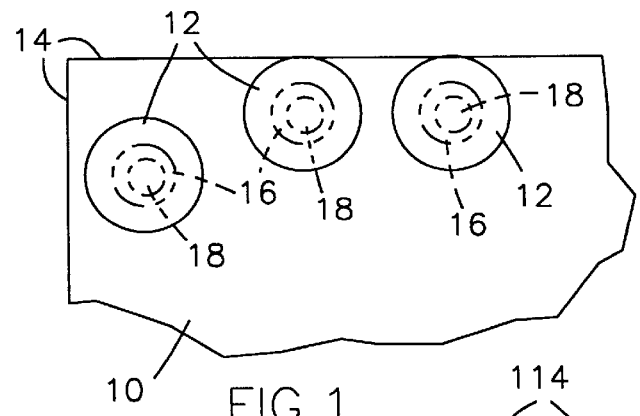
FIG. 1 is a plan view of a corner of a flip chip having circular-shaped input/output pads configured in accordance with the prior art.
Figure 6:
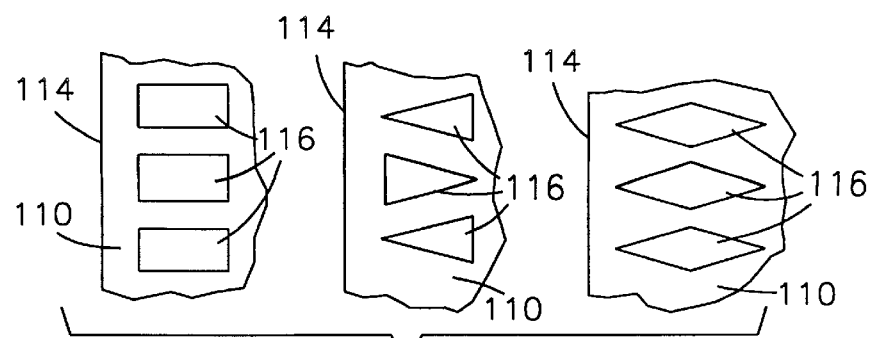
FIG. 6 represents suitable shapes for the input/output pads of this invention.

The accuracy with which the dimensions of the input/output pads 116 can be tailored by photo-imaging techniques yields solder bump connections 120 whose size, shape and height can be more precisely and readily obtained than is possible with prior art circular-shaped input/output pads of the type shown in FIG. 1. In addition to the oval shape shown in FIG. 2, some of the other geometric shapes that are possible for the pads 116 of this invention include rectangular, triangular and diamond-shaped, each of which is represented in FIG. 6, though it is foreseeable that other shapes could be used, including hexagonal, pentagonal, square and contoured shapes, e.g., "comma"-shaped pads 116. As will become apparent from the following description, particularly desirable shapes for the input/output pads 116 are those that are elongated in the direction perpendicular to the adjacent edge 114 of the chip 110, as illustrated in FIG. 2. Oblong-type shapes such as those shown in FIGS. 2, 3 and 6 are required for the pads 116 to achieve the objects of this invention. Orienting the longitudinal axis of each input/output pad 116 (coinciding with a maximum dimension of the pad 116) to be substantially perpendicular to an adjacent edge 114 of the chip 110, as shown in FIGS. 2 and 3, serves to optimize solder bump spacing.

The oblong shape of the pads 116 enables the relative position of the solder bumps 112 to be varied without altering the location of the vias 118 through which the pads 116 are electrically interconnected with the circuitry of the flip chip 110. As seen in FIG. 2, though the vias 118 are equally spaced from the edges 114 of the chip 110, the outboard edge of one solder bump 112 is shown as projecting over an edge 114, while a second bump 112 is shown coincident with an edge and a third bump 112 is spaced inwardly from an edge 114. Shifts in location of the pads 116 relative to the edges 114 as shown in FIG. 2 allow for ease of underfill and reduce the opportunity for solder bridging between adjacent connections 120.

The solder bumps 112 are generally formed directly on the pads 116 prior to registration with a conductor pattern. The solder alloy for the bumps 112 can be deposited on the pads 116 as a solder paste by screen printing, or by known electroplating or evaporation techniques, as is conventional. Suitable solder alloys include, but are not limited to, tin-lead alloys containing about 10 to about 60 percent tin, with possible alloying additions. The solder is deposited on the pads 116 such that, after reflowing, each resulting solder bump 112 will accurately and uniquely register with a corresponding conductor when the chip 110 is registered with its complementary conductor pattern 126. Thereafter, the solder bumps 112 are reflowed by heating, such that the solder wets and adheres to the conductors, thereby attaching the chip 110 to the conductor pattern 126 and the underlying substrate 122, as depicted in FIG. 3. Reflow can be achieved by any of a number of techniques well known in the art, and therefore will not be discussed in detail here. FIG. 3 shows the optional use of solder stops 124 to assist in limiting the surfaces of the conductors over which the molten solder bumps 112 flow during reflow.

During the evaluation of this invention, reflowed solder bumps were formed on flip chips having oblong input/output pads shaped similarly to that of FIG. 2, and prior art circular-shaped input/output pads such as that shown in FIG. 1. The center-to-center distance between adjacent pads of each type was about 0.5 millimeter or less. The solder bumps were then examined to determine the relationship between solder bump height and solder bump volume, and between solder bump spacing and solder bump volume, the results of which were normalized and plotted as shown in FIGS. 4 and 5, respectively.

Figure 4:
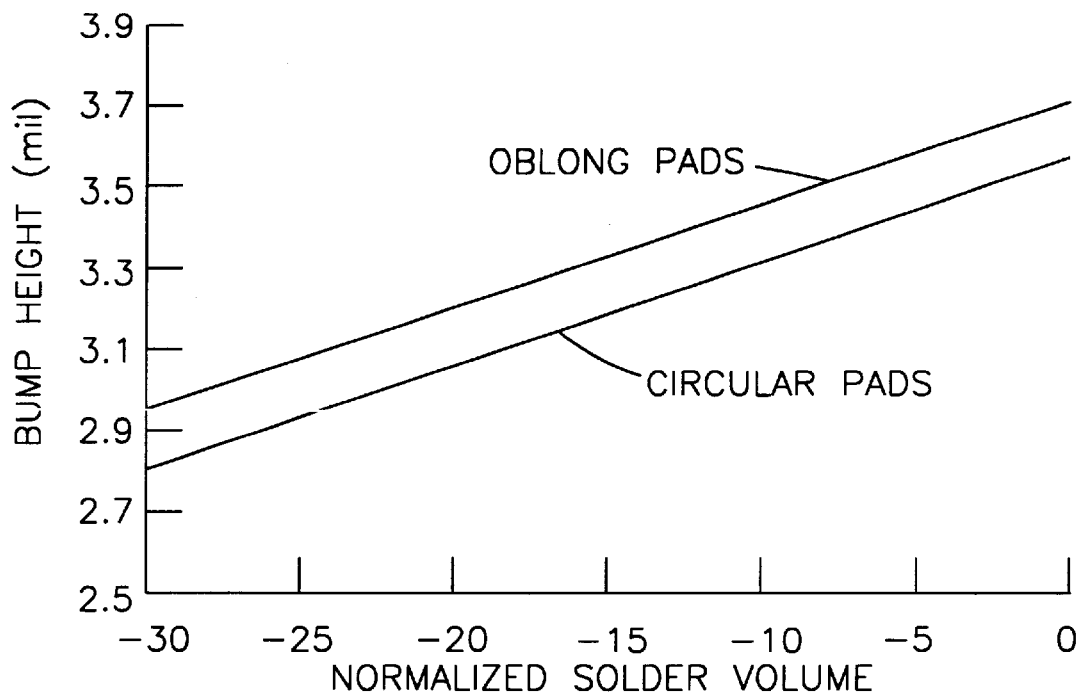
FIG. 4 is a graph evidencing improved solder bump height achieved by the use of input/output pads in accordance with this invention.
Figure 5:
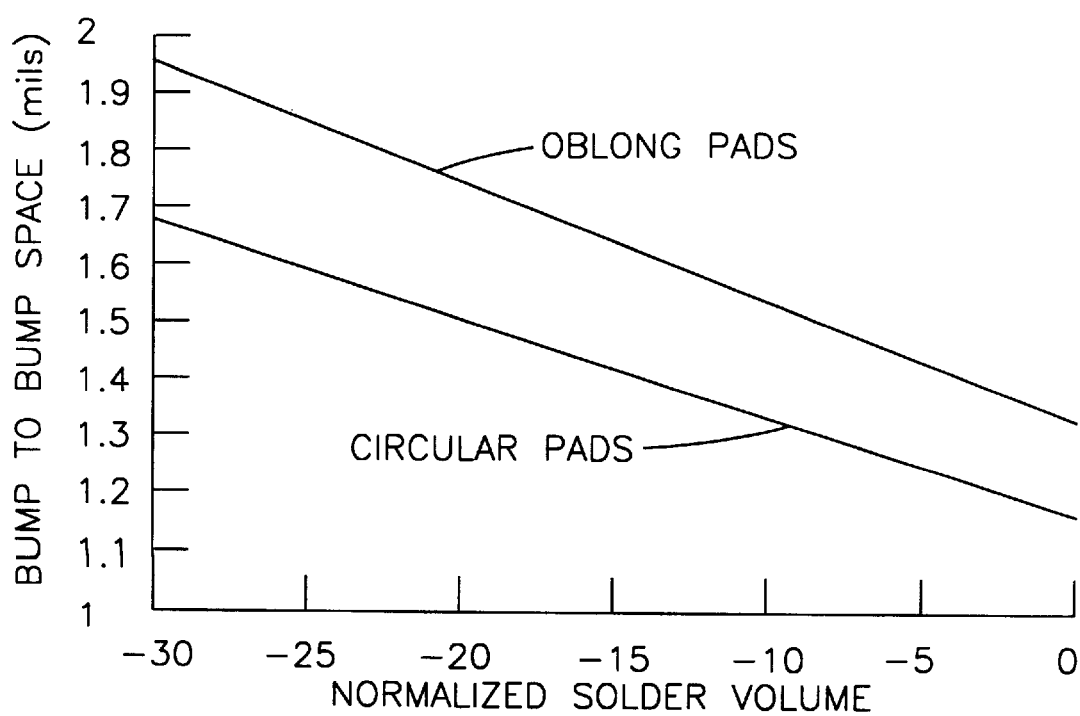
FIG. 5 is a graph evidencing improved solder bump spacing achieved by the use of input/output pads in accordance with this invention.

FIG. 4 evidences that pads 116 shaped in accordance with the invention provide a consistent improvement in solder bump height of about 3% to 5% over prior art pads. FIG. 5 evidences an increase of about 13% to 17% in spacing between adjacent solder bumps formed on the pads 116 of this invention as compared to the prior art pads. The increase in solder bump spacing achieved by pads shaped in accordance with this invention is particularly significant for flip chips with fine pitch terminals, and from the standpoint of avoiding solder bridging between adjacent solder bump connections 120 during and following reflow. From FIG. 2, this improvement can be seen as the result of the oblong pads 116 drawing the molten solder out along the length of each pad 116 during reflow. Another significant advantage associated with greater solder bump spacing is that epoxy underfill is facilitated because the oblong shapes of the solder bumps 112 serve to direct the epoxy under the chip 110.

The increase noted above for solder bump height is also significant, particularly considering that such improvements are simultaneously achieved with increased solder bump spacing and without additional solder volume. Benefits attributable to this aspect of the invention include minimized stress in the resulting solder bump connection and easier epoxy underfill.

From the above, those skilled in the art will appreciate that increased solder bump spacing can be achieved with the teachings of this invention by forming adjacent pairs of input/output pads 116 to have triangular shapes, with adjacent pads 116 having corners facing in opposite directions as shown in FIG. 6. Furthermore, the degree to which the input/output pads 116 of this invention are able to determine the subsequent shape of a solder bump can be used to achieve other advantages. For example, diamond-shaped pads 116 (e.g., FIG. 6) can yield solder bumps whose thickness is tapered in the longitudinal direction of the pad 116, with a maximum thickness near the midpoint of the pad 116. Such a result can yield a graded solder-to-conductor interface that reduces stresses at the interface during thermal excursions. In addition, alignment of a flip chip with its conductor pattern can be facilitated by forming square or rectangular-shaped input/output pads 116 and complementarily-shaped pillars near the corners of the chip 110.

While the invention has been described in terms of a preferred embodiment, it is apparent that other forms could be adopted by one skilled in the art. Accordingly, the scope of the invention is to be limited only by the following claims.

What is claimed is:

1. A surface mount semiconductor circuit device comprising:

a substrate having a surface with at least one edge defining a periphery of the device;

vias in the surface of the substrate, at least two of the vias being adjacent to each other and substantially equally spaced from the edge of the substrate;

solderable input/output pads on the at least two vias, a first of the input/output pads being closer to the edge of the substrate than a second of the input/output pads, each of the input/output pads having an oblong shape in a direction perpendicular to the edge of the substrate; and a reflowed solder bump on each of the input/output pads, each of the reflowed solder bumps having an oblong shape congruent to the oblong shape of its corresponding input/output pad.

2. A surface mount semiconductor circuit device as recited in claim 1, wherein the reflowed solder bumps mechanically and electrically connect the input/output pads to conductors.

3. A surface mount semiconductor circuit device as recited in claim 1, wherein each of the input/output pads has a shape chosen from the group consisting of rectangular, triangular, oval and diamond-shaped.

4. A surface mount semiconductor circuit device as recited in claim 1, wherein all of the vias are substantially equally spaced from the periphery of the device, all of the vias are covered by solderable input/output pads, and some of the input/output pads are located closer to the periphery of the device than a remainder of the input/output pads.

5. A surface mount semiconductor circuit device as recited in claim 4, wherein the vias electrically connect the input/output pads with circuitry on the device, and the input/output pads of each adjacent pair of the input/output pads are spaced different distances from the periphery of the device.

6. A surface mount semiconductor circuit device as recited in claim 1, wherein each of the input/output pads has a triangular shape, each adjacent pair of input/output pads having corners facing in opposite directions.

7. A surface mount semiconductor circuit device as recited in claim 1, wherein each of the input/output pads comprises a multilayer structure of an aluminum layer, a nickel-vanadium layer overlying the aluminum layer, and a copper layer overlying the nickel-vanadium layer.

8. A surface mount semiconductor circuit device as recited in claim 1, wherein the solder bump on the first input/output pad projects over an edge of the device.

9. A surface mount semiconductor circuit device as recited in claim 1, wherein the via beneath the first input/output pad is beneath an end of the first input/output pad farthest from the edge of the substrate, and the via beneath the second input/output pad is beneath an end of the second input/output pad closest to the edge of the substrate.

10. A surface mount semiconductor circuit device as recited in claim 1, the device being a flip chip.

11. A surface mount semiconductor circuit device as recited in claim 10, wherein the device is mounted to a circuit board having a conductor pattern comprising a plurality of conductors, the reflowed solder bumps mechanically and electrically connecting the input/output pads to the conductors.

* * * * *